United States Patent [19]

Takebuchi

[11] Patent Number: 5,341,329
[45] Date of Patent: Aug. 23, 1994

[54] NONVOLATILE SEMICONDUCTOR MEMORY DEVICE CAPABLE OF PREVENTING READ ERROR CAUSED BY OVERERASE STATE AND METHOD THEREFOR

[75] Inventor: Masataka Takebuchi, Yokohama, Japan

[73] Assignee: Kabushiki Kaisha Toshiba, Kawasaki, Japan

[21] Appl. No.: 118,285

[22] Filed: Sep. 9, 1993

Related U.S. Application Data

[63] Continuation of Ser. No. 752,956, Aug. 28, 1991, abandoned, which is a continuation of Ser. No. 456,869, Dec. 27, 1989, abandoned.

[30] Foreign Application Priority Data

Dec. 28, 1988 [JP] Japan .................. 63-333561

[51] Int. Cl.⁵ ............................................. G11C 16/06
[52] U.S. Cl. ........................ 365/185; 365/189.09; 365/189.11; 365/218
[58] Field of Search .................... 365/185, 189.11, 218, 365/226, 230.06, 204, 189.09; 257/314

[56] References Cited

U.S. PATENT DOCUMENTS

| | | | |
|---|---|---|---|
| 4,281,397 | 7/1981 | Neal et al. ........................... | 365/185 |
| 4,376,947 | 3/1983 | Chiu et al. .......................... | 365/185 |
| 4,384,349 | 5/1983 | McElroy .............................. | 365/185 |
| 4,387,447 | 6/1983 | Klaas et al. ......................... | 365/185 |
| 4,425,632 | 1/1984 | Iwahashi et al. ................ | 365/189.09 |
| 4,691,298 | 9/1987 | Fukada et al. .................. | 365/189.05 |
| 4,727,515 | 2/1988 | Hsu ..................................... | 365/185 |
| 4,912,676 | 3/1990 | Paterson et al. ..................... | 365/185 |
| 4,930,105 | 5/1990 | Matsumoto et al. ................. | 365/185 |
| 4,996,571 | 2/1991 | Kume et al. ......................... | 365/218 |
| 5,097,444 | 3/1992 | Fong .................................... | 365/185 |
| 5,105,386 | 4/1992 | Andoh et al. ........................ | 365/185 |
| 5,122,985 | 6/1992 | Santin ................................. | 365/185 |
| 5,132,935 | 7/1992 | Ashmore, Jr. ....................... | 365/185 |

FOREIGN PATENT DOCUMENTS

| | | | |
|---|---|---|---|
| 0083194 | 7/1983 | European Pat. Off. ............ | 365/185 |
| 0182198 | 5/1986 | European Pat. Off. . | |

OTHER PUBLICATIONS

"A Single Transistor EEPROM Cell and Its Implementation In A 512k CMOS EEPROM", Satyen Mukherjee, et al. IEDM Technical Digest, May, 1985 pp. 616–619

"Started Shifting From EEPROM To One Transistor/Cell", Nikkei Microdevices Mar., 1986 pp. 75–76.

Tanaka et al., "A Programmable 256K CMOS EPROM with On-Chip Test Circuits", IEEE ISSCC, Feb. 1984 pp. 148–149.

Primary Examiner—Joseph L. Dixon
Assistant Examiner—Jack A. Lane
Attorney, Agent, or Firm—Banner, Birch, McKie & Beckett

[57] ABSTRACT

A non-volatile semiconductor memory device includes a voltage supply circuit for supplying a positive voltage to the source line or bit line (to which a low biasing voltage is conventionally applied) with respect to each of non-volatile memory cells in a memory cell array in a data read mode. Since this voltage supply circuit applies the positive voltage to the memory cells in the data read mode, an effect equivalent to back gate biasing of the memory cells can be achieved. Accordingly, a memory cell in an overerase state has, a positive threshold voltage in the data read mode.

29 Claims, 5 Drawing Sheets

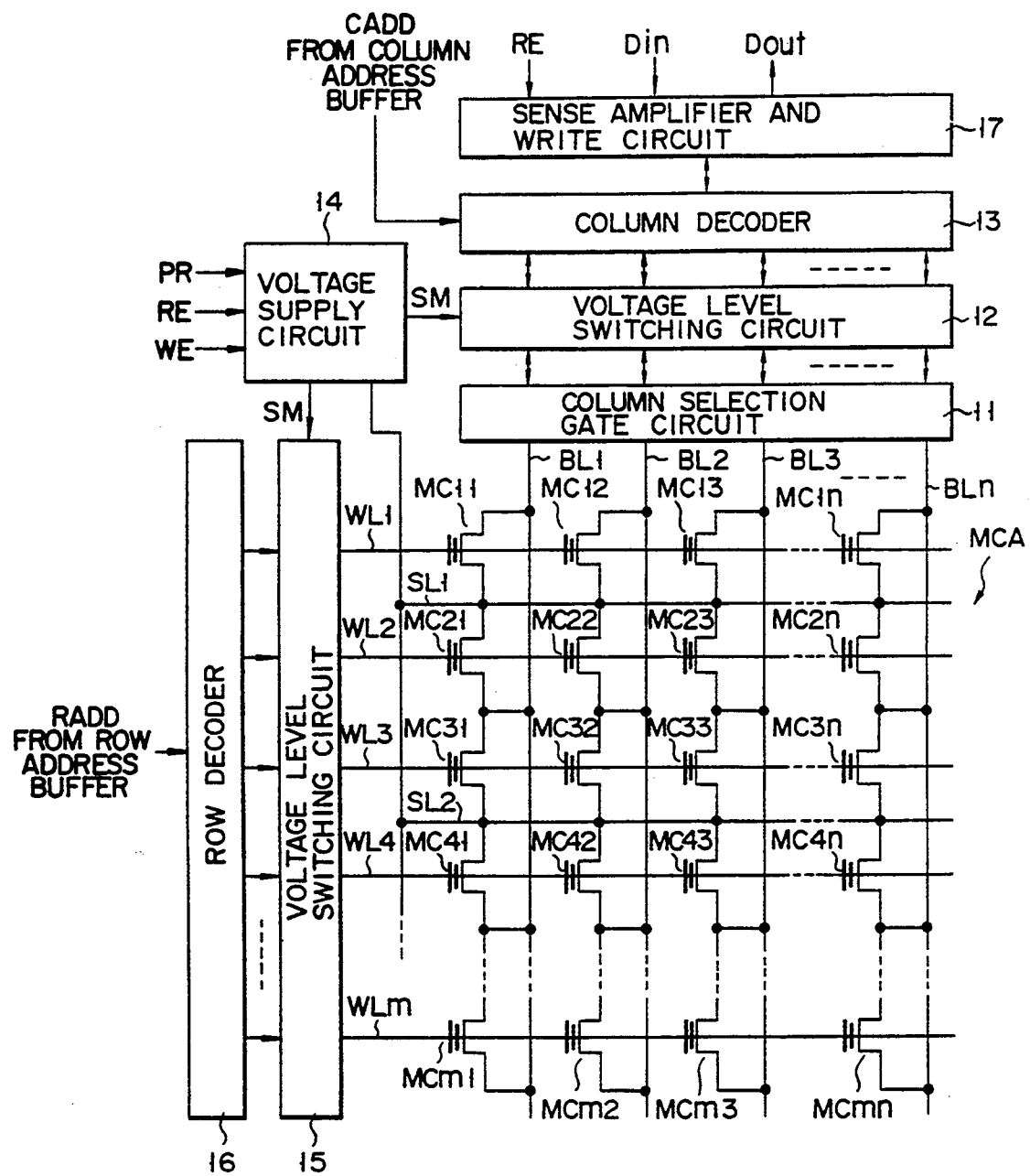
F I G. 1

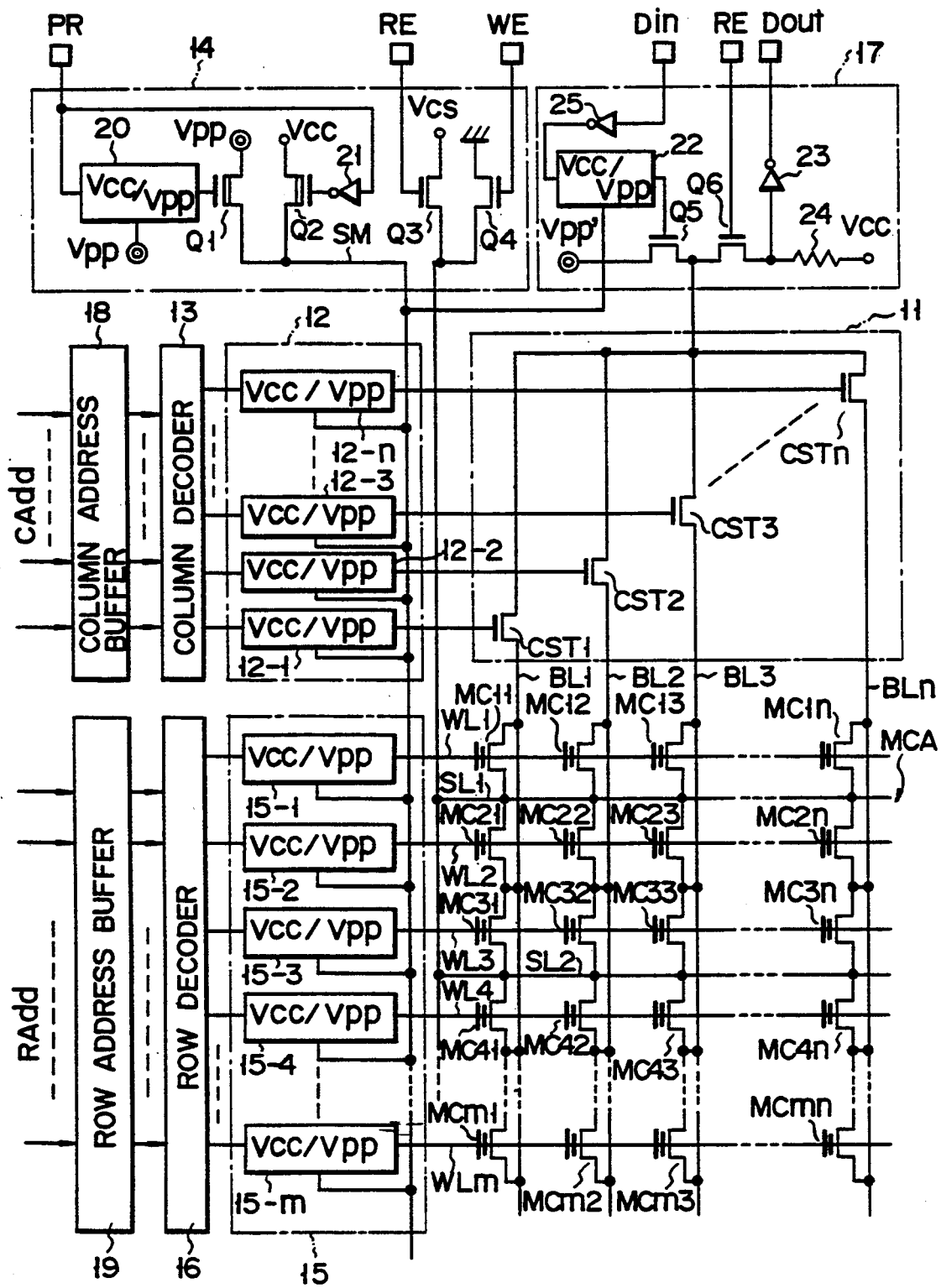
F I G. 2

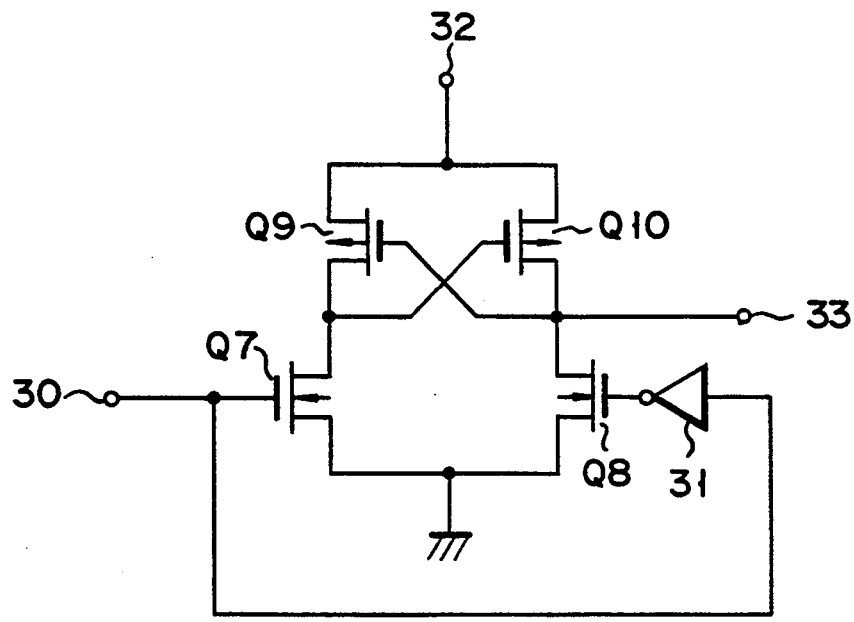
F I G. 3
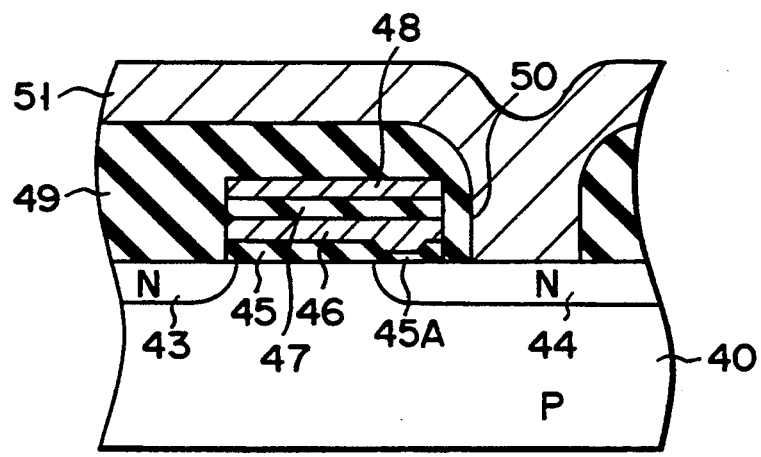
F I G. 5

NONVOLATILE SEMICONDUCTOR MEMORY DEVICE CAPABLE OF PREVENTING READ ERROR CAUSED BY OVERERASE STATE AND METHOD THEREFOR

This application is a continuation of application Ser. No. 07/752,956 filed Aug. 28, 1991, now abandoned, which is a continuation of 07/456,869 filed Dec. 27, 1989, now abandoned.

BACKGROUND OF THE INVENTION

1. Field of the Invention

The present invention relates to a non-volatile semiconductor memory device and, more particularly, to an electrically erasable and programmable read-only memory (to be referred to as an EEPROM hereinafter) having a gate electrode with a two-layered structure.

2. Description of the Related Art

A conventional electrically erasable PROM cell is classified into the following two types. That is, a cell having a two-layered polysilicon gate electrode structure including floating and control gate electrodes, and a cell having a three-layered polysilicon gate electrode structure including an erase gate electrode in addition to the floating and control gate electrodes.

The former EEPROM cell is disclosed in, e.g., IEDM TECHNICAL DIGEST. 1985, pp. 616–619, "A SINGLE TRANSISTOR EEPROM CELL AND ITS IMPLEMENTATION IN A 512K CMOS EEPROM", Satyen Mukherjee et al. This EEPROM cell is constituted by one transistor. Therefore, this EEPROM cell has a small area, and is suitable for high integration. In addition, U.S. Pat. No. 4,467,453 discloses an equivalent circuit and some of peripheral circuits in a memory cell array in which the EEPROM cells are arranged in a matrix form.

In an EEPROM cell of this type, however, when the cell is subjected to overerase upon an erasing operation of data, a threshold voltage $V_{TH}$ of a cell transistor is set to be negative to cause a read error. The above overerase state is caused by the following mechanism. More specifically, in the conventional EEPROM, data stored in the cell transistor is simultaneously erased in advance prior to writing data. The memory cell array before an erase operation includes a cell which stores data "0" (cell having a floating gate in which electrons are accumulated) and a cell which stores data "1" (cell having a floating gate in which electrons are not accumulated). When the stored data are simultaneously erased in the above state, excessive electrons may often be discharged from the floating gate of the cell. The state wherein excessive negative electric charges are discharged from the floating gate is equivalent to a state wherein positive charges are accumulated in the floating gate. The cell having the floating gate from which excessive electrons are discharged is a cell in the overerase state. In a cell in such an overerase state, a channel which is present in a substrate under the floating gate electrode is inverted to obtain the depletion type cell transistor. In a read mode, assume that a memory cell connected to a bit line to which the selected memory cell is connected is in the overerase state. Even if this memory cell in the overerase state is non-selected (connected to a non-selected word line), and the selected cell is in a "0" write state, it is determined that data stored in the selected cell is "1". This is caused for the following reason. The selected memory cell is not turned on. However, since the memory cell in the overerase state (normally ON) is connected to the bit line to which the selected memory cell is connected, the bit line is discharged through a current path between the drain and the source of the memory cell in the overerase state. Therefore, in order to prevent such a read error, conventionally, the discharge conditions of electrons from the floating gate in an erase mode are optimized, thus setting the threshold voltage $V_{TH}$ of the cell transistor after an erase operation to be positive.

As described above, however, in order to optimize the electron discharge conditions, electrons must be discharged while an amount of electrons accumulated in the floating gate is monitored. For this reason, an erase operation is complicated, and it is difficult to control the erasing of data.

The latter EEPROM cell is disclosed in NIKKEI MICRODEVICES, 1986, March, "A tendency toward a one transistor/cell EEPROM pp. 75–76".

In this EEPROM cell, a boosted high voltage is applied to an erase gate electrode upon an erase operation of stored data. According to a structure described in this literature, an offset region in which the floating gate electrode is not formed is arranged on a part of a channel region in order to prevent a read error even if a threshold voltage $V_{TH}$ of the cell transistor after an erase operation becomes negative due to the above-mentioned overerase state. In this offset region, the channel region is opposite to a control gate electrode via a gate insulating film, thus forming an offset MOS transistor. Even if the channel region under the floating gate electrode is inverted due to the overerase state, the channel region under the offset region is not inverted unless the cell is selected and a voltage is applied to the control gate electrode. In other words, the offset MOS transistor is not turned on unless the EEPROM cell is selected. Thus, even if the cell is in the overerase state, a current does not flow through a current path between the drain and the source. As a result, a read error can be prevented.

This EEPROM cell, however, substantially consists of two transistors. Therefore, a cell area is undesirably increased.

SUMMARY OF THE INVENTION

It is, therefore, an object of the present invention to provide a non-volatile semiconductor device which can prevent a read error without necessity of optimizing the erase time and increasing the cell area even if an overerase state is set and a cell transistor having a negative threshold voltage is present.

In order to achieve the above object of the present invention, there is provided a non-volatile semiconductor memory device comprising a memory cell array in which non-volatile memory cells are arranged in a matrix form, a row selection circuit for selecting a row of non-volatile memory cells in the memory cell array, a column selection circuit for selecting a column of non-volatile memory cells in the memory cell array, a first voltage level switching circuit for switching an output voltage level of the row selection circuit, a second voltage level switching circuit for switching an output voltage level of the column selection circuit, and a voltage supply circuit for controlling the first and second voltage level switching circuits, and supplying a positive voltage to a source or bit line to which a low biasing voltage is applied with respect to each non-volatile memory cell in the memory cell array in a data read mode.

With the above arrangement, in the data read mode, the voltage supply circuit applies a positive voltage to the source or bit line to which a low biasing voltage is normally applied (e.g., the source line) with respect to all the cells. As a result, the same effect as in a back gate biasing effect with respect to all the cell transistors can be achieved. Thus, in the read mode, the threshold voltage of the cell transistor which is set to be negative after an erase operation due to an overerase state is substantially shifted to a positive value, thus reading out data. Therefore, a read error, which is caused when the cell transistor in the overerase state is connected to the same bit line as that of the selected cell transistor, can be prevented without necessity of optimizing the erase time. Note that since the memory cell consists of one cell transistor, a cell area is not increased.

BRIEF DESCRIPTION OF THE DRAWINGS

FIG. 1 is a schematic circuit diagram showing a memory cell array and some of the peripheral circuits to explain a non-volatile semiconductor memory device according to an embodiment of the present invention;

FIG. 2 is a circuit diagram showing a detailed arrangement of the circuit shown in FIG. 1;

FIG. 3 is a circuit diagram showing an arrangement of a voltage level switching circuit in the circuit shown in FIG. 2;

FIG. 5 is a sectional view showing another cross section of the pattern shown in FIG. 4A taken along the line X—X'.

DETAILED DESCRIPTION OF THE PREFERRED EMBODIMENTS

Figure 4A:
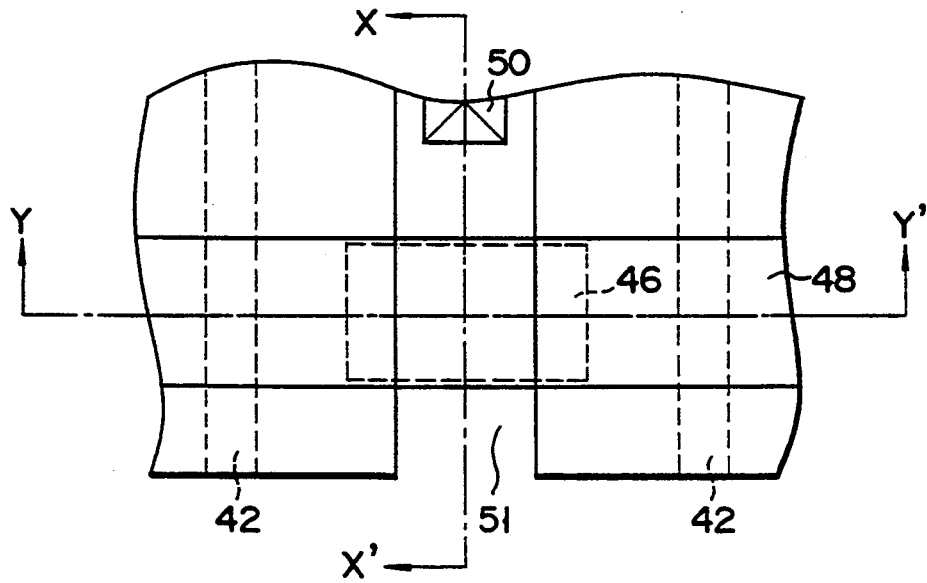
FIG. 4A is a plan view of a pattern showing an arrangement of a memory cell transistor in the circuit shown in FIGS. 1 and 2.

FIG. 1 is a schematic circuit diagram showing a memory cell and some of the peripheral circuits in a semiconductor integrated circuit (e.g., an EEPROM integrated circuit, and an EEPROM hybrid logic integrated circuit, to be generally referred to as EEPROMs) having an EEPROM cell array. In a memory cell array MCA, memory cells (cell transistors) MC11 to MCmn are arranged in a matrix form. Each of bit lines BL1 to BLn is connected to the drains of the cell transistors MC11 to MCmn in units of columns. Each of word lines WL1 to WLm is connected to control gates of the cell transistors MC11 to MCmn in units of rows. Each of source lines SL1, SL2, . . . is connected to the sources of the cell transistors MC11 to MCmn in units of two rows. At this time, the sources of the two cell transistors which are adjacent to each other, e.g., MC11 and MC21, MC12 and MC22, . . . , MC1n and MC2n, are connected to the common source line SL1. The sources of the cell transistors MC31 and MC41, MC32 and MC42, . . . , MC3n and MC4n are connected to the common source line SL2. A column selection gate circuit 11 is connected to one end of each of the bit lines BL1 to BLn. A first voltage level switching circuit 12 (also referred to as first voltage level setting circuit) is connected to the column selection gate circuit 11. The voltage level switching circuit 12 is connected to a column decoder 13, and is controlled in response to an operation mode designation signal SM output from a voltage supply circuit 14. A voltage level of a decode signal output from the column decoder 13 is set at (1) a power source voltage Vcc, (2) 1 to 2 V or (3) a high power source voltage Vpp by means of the voltage level switching circuit 12.

A second voltage level switching circuit 15 (also referred to as second voltage level setting circuit) is connected to one end of each of the word lines WL1 to WLm. This circuit 15 receives an output from a row decoder 16, and is controlled in response to the operation mode designation signal SM output from the voltage supply circuit 14. A voltage level of a decode signal output from the row decoder 16 is set by the voltage level switching circuit 15 at the power source voltage Vcc level or the high power source voltage Vpp level.

The voltage supply circuit 14 supplies the operation mode designation signal SM to the first and second voltage level switching circuits 12 and 15 to control them. The voltage supply circuit 14 also applies a ground potential to the source lines SL1, SL2, . . . in a write mode, and applies a voltage of 2 V to these lines in a read mode, thus setting a high-impedance state in an erase mode.

A sense amplifier and write circuit 17 is connected to the column decoder 13. Write data Din is input to the sense amplifier and write circuit 17, and is written in the selected memory cell MC. Read data Dout from the selected memory cell MC is amplified by and output from the sense amplifier and write circuit 17.

FIG. 2 is a circuit diagram showing a detailed arrangement of the circuit shown in FIG. 1. The column selection gate circuit 11 consists of column selection transistors CST1 to CSTn, one end of a current path of each of which is connected to the corresponding one of the bit lines BL1 to BLn. The other end of the current path of each of the transistors CST1 to CSTn is commonly connected. The gate of each of the transistors CST1 to CSTn receives an output from the first voltage level switching circuit 12, and is ON/OFF-controlled. This switching circuit 12 includes voltage level switching sections 12-1 to 12-n corresponding to the transistors CST1 to CSTn. These switching sections 12-1 to 12-n switch an output from the column decoder 13 from/to the Vcc or Vpp level in response to the operation mode designation signal SM output from the voltage supply circuit 14. The column decoder 13 receives an output from a column address buffer 18. The column address buffer 18 receives and temporarily stores a column address signal CAdd.

Arrangements of the second voltage level switching circuit 15 and the row decoder 16 are basically the same as those of the first voltage level switching circuit 12 and the column decoder 13, respectively. The switching circuit 15 includes voltage level switching sections 15-1 to 15-m corresponding to the word lines WL1 to WLm. These switching sections 15-1 to 15-m switch an output from the row decoder 16 from/to the vcc or Vpp level under the control performed in response to the operation mode designation signal SM output from the voltage supply circuit 14. The row decoder 16 receives an output from a row address buffer 19. The row address buffer 19 receives and temporarily stores a row address signal RAdd.

The voltage supply circuit 14 includes a voltage level switching section 20, depletion type MOS transistors Q1 and Q2, an inverter 21, and enhancement type transistors Q3 and Q4. The input terminal of the voltage level switching section 20 receives a program signal PR, the output terminal thereof is connected to the gate of the MOS transistor Q1, and the control input terminal thereof is connected to a high-voltage power source vpp. The high-voltage power source Vpp is connected to one end of a current path of the MOS transistor Q1. The input terminal of the inverter 21 receives the program signal PR, and the output terminal thereof is connected to the gate of the MOS transistor Q2. One end of a current path of the MOS transistor Q2 is connected to a power source Vcc, and its other end is connected to the other end of the current path of the MOS transistor Q1. A potential at the common connecting point which connects the other end of the current path of the MOS transistor Q1 to the other end of that of the MOS transistor Q2 is supplied to a control input terminal of each of the voltage level switching sections 12-1 to 12-n, and 15-1 to 15-m as the operation mode designation signal SM. A voltage Vcs is applied to one end of the current path of the MOS transistor Q3, and the gate thereof receives a read enable signal RE to be ON/OFF-controlled. The voltage Vcs is produced by resistance-dividing, e.g., the power source voltage vcc, and is set at about 2 V. The power source voltage Vcc may be applied to the transistor Q3 as the above voltage vcs to reduce the voltage Vcc to about 2 V by a threshold voltage of the MOS transistors Q3. One end of a current path of the MOS transistor Q4 is connected to the ground point, its other end is connected to the other end of the current path of the MOS transistor Q3, and its gate receives a write enable signal WE to be ON/OFF-controlled. The common connecting point which connects the other end of the current path of the MOS transistor Q3 to the other end of that of the MOS transistor Q4 is connected to the common source lines SL1, SL2, ... Therefore, the voltage Vcs (2 V) or the ground potential is selectively applied to the common source lines SL1, SL2, ... in accordance with an operation mode.

The sense amplifier and write circuit 17 includes a voltage level switching section 22, enhancement type MOS transistors Q5 and Q6, inverters 23 and 25, and a resistor 24. The input terminal of the voltage level switching section 22 receives the input signal (write data) Din through the inverter 25, its output terminal is connected to the gate of the MOS transistor Q5, and its control input terminal is connected to the common connecting point which connects the other end of the current path of the MOS transistor Q1 to the other end of that of the transistor Q2, thus receiving the operation mode designation signal SM. The current paths of the MOS transistors Q5 and Q6 and the resistor 24 are connected in series between a high-voltage power source Vpp' and the power source Vcc. The read enable signal RE is supplied to the gate of the MOS transistor Q6. The connecting point of the MOS transistors Q5 and Q6 is connected to the common connecting point of each of the other end of the current paths of the column selection transistors CST1 to CSTn. The connecting point of the MOS transistor Q6 and the resistor 24 is connected to the input terminal of the inverter 23 for reading data. The read data Dout is output from the output terminal of the inverter 23.

Note that a voltage of 0 V or 12.5 V is selectively applied to the high-voltage power source Vpp in an erase or data "0" write mode. A voltage of 20 V or 10 V is selectively applied to the high-voltage power source Vpp' in the erase or data "0" write mode. The voltage of 12.5 V is externally applied, and the voltage of 20 V is produced by boosting the voltage of 12.5 V or the power source voltage of 5 V inside the memory. The voltage of 10 V is produced by decreasing the voltage of 12.5 V.

FIG. 3 shows an arrangement of the voltage level switching sections 12-1 to 12-n, 15-1 to 15-m, 20, and 22 in the circuit shown in FIG. 2. An input terminal 30 is connected to the gate of an n-channel MOS transistor Q7 and the input terminal of an inverter 31. The output terminal of the inverter 31 is connected to the gate of an n-channel MOS transistor QS. One end of a current path of the MOS transistor Q7 is connected to one end of that of the MOS transistor Q8, and the connecting point is connected to ground. The other end of the current path of each of the MOS transistors Q7 and Q8 is connected to one end of a current path of the corresponding one of p-channel MOS transistors Q9 and Q10. The other end of the current path of the MOS transistor Q9 is connected to the other end of that of the MOS transistor Q10, and the connecting point is connected to a control terminal 32. The gate of the MOS transistors Q10 is connected to the common connecting point of the MOS transistors Q7 and Q9. The gate of the MOS transistors Q9 is connected to the common connecting point of the MOS transistors Q8 and Q10 and an output terminal 33.

Figure 4B:
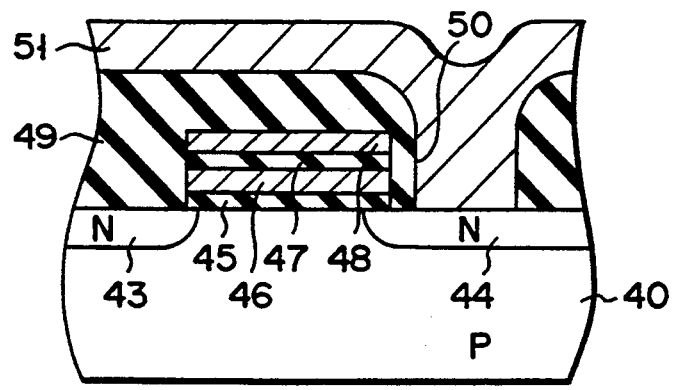
FIG. 4B is a sectional view of the pattern shown in FIG. 4A taken along the line X-X'.
Figure 4C:
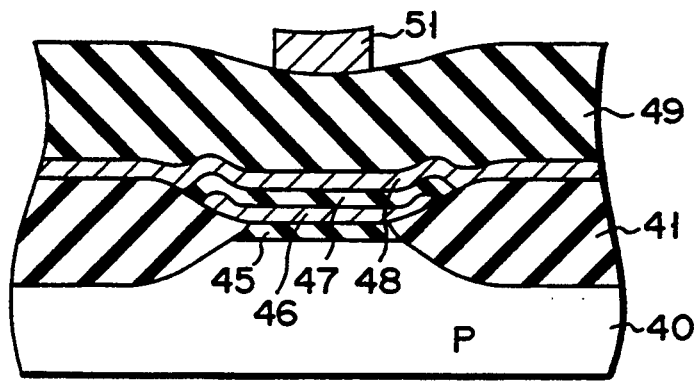
FIG. 4C is a sectional view of the pattern shown in FIG. 4A taken along the line Y—Y'.

Each memory cell transistor MC is constituted as shown, e.g., in FIGS. 4A to 4C. FIG. 4A is a pattern plan view, and FIGS. 4B and 4C are sectional views respectively taken along the lines X—X' and Y—Y' in FIG. 4A.

A field insulating film 41 for element isolation is formed on a major surface of a p-type silicon substrate 40, and an element active region is defined by the field insulating film 41. N-type source and drain regions 43 and 44 are formed in the surface region of the substrate 40 in the element active region to be spaced apart from each other by a predetermined distance. A first gate insulating film 45, a floating gate electrode 46, a second gate insulating film 47, and a control gate electrode 48 are stacked on the substrate 40 serving as a channel region between the source and drain regions 43 and 44. The control gate electrode 48 is formed along the row direction of the memory cell array MCA. An interlayer insulating film 49 is formed on the resultant structure. A contact hole 50 is formed in a portion of the interlayer insulating film 49 on the drain region 44. A bit line 51 is formed on the interlayer insulating film 49 along the column direction of the memory cell array MCA, and is connected to the drain region 44 through the contact hole 50.

As shown in FIG. 5, in order to enhance an erase efficiency, a relatively thin region 45A may be formed in a part of the first gate oxide film 45 between the floating gate electrode 46 and the drain region 44 (or the source region 43) to discharge electrons from the floating gate electrode 46 utilizing the region 45A.

An operation of the EEPROM with the above-mentioned structure will be described hereinafter.

A feature of the present invention is as follows. The voltage supply circuit 14 and the first and second voltage level switching circuits 12 and 15 are arranged in the present invention, and a voltage supplied to the memory cell transistor MC in a read mode is different from that in the prior art.

A relationship between each operation mode and control gate, drain, and source voltages $V_G$, $V_D$, and $V_S$ is shown in the following table:

TABLE

| operation mode | gate voltage $V_G$ | drain voltage $V_D$ | source voltage $V_S$ |
| --- | --- | --- | --- |
| erase mode | 0 V | 20 V | open |
| write "0" mode | 12.5 V | 10 V | 0 V |
| write "1" mode | 0 V | 0 V | 0 V |
| read mode | Vcc (5 V) | 5 V | 2 V |

An operation in the erase or write mode is basically performed as in the prior art. More specifically, when stored data are simultaneously erased, the program signal PR goes to a logic "1" (high level), and the read and write enable signals RE and WE go to low level. A voltage of, e.g., 20 V is used as a voltage of the high-voltage power source Vpp. This voltage is produced by boosting the power source voltage of 5 V or the externally applied voltage of 12.5 inside the memory. All outputs from the column decoder 13 go to high level, and all outputs from the row decoder 16 go to low level. A logic "0" (low level) output is supplied as the write data Din. Therefore, the high voltage Vpp is applied to the gate of the MOS transistor Q1, and the MOS transistor Q1 is turned on. The transistor Q2 is turned off, and the MOS transistors Q3 and Q4 are turned off. The MOS transistor Q1 is turned on, and hence the mode designation signal SM goes to a Vpp (20 V) level. Since all the outputs from the column decoder 13 are set at high level, all the outputs from the voltage level switching circuit 12 go to the Vpp level, and the voltage Vpp is applied to the gates of the column selection transistors CST1 to CSTn. As a result, all the column selection transistors CST1 to CSTn are turned on. At the same time, the mode designation signal SM goes to the Vpp level, so that an output from the switching section 22 goes to a Vpp' level, and the MOS transistor Q5 is turned on (the transistor Q6 is OFF), thus applying the high voltage Vpp' (20 V) to all the bit lines BL1 to BLn. On the other hand, since all outputs from the row decoder 16 are set at the low level, all outputs from the voltage switching circuit 15 are set at the low level, i.e., a ground potential, and this ground potential is applied to all the word lines WL1 to WLm. At this time, the MOS transistors Q3 and Q4 are OFF in accordance with the low level of the read and write enable signals RE and WE, and hence all the source lines SL1, SL2, . . . are opened. As a result, a high voltage is applied across the drain region 44 and the control gate electrode 48 in each memory cell transistor MC (FIG. 4B), and electrons in the floating gate electrode 46 are discharged into the drain region 44 by a tunnel current in the first gate insulating film 45, thus setting an erase state of all the memory cells MC11 to MCmn. More specifically, a threshold voltage viewed from the control gate electrode 48 in the memory cell transistor MC is decreased, and the transistor becomes slightly of a depletion type, thus being turned on ("1").

When a data "0" write operation is performed after an erase operation, the program signal PR and the write enable signal WE go to the high level, and the read enable signal RE goes to the low level. Data "0" (low level) is supplied as the write data Din. Voltages of 12.5 V and 10 V are applied to the high-voltage power sources Vpp and Vpp', respectively. Thus, the high voltage vpp (12.5 V) is applied to the gate of the MOS transistor Q1, and the transistor Q1 is turned on. The MOS transistors Q2, Q3, and Q6 are turned off, and the MOS transistors Q4 and Q5 are turned on. For example, if the memory cell transistor MC22 is selected, and data "0" is written in the transistor MC22, an output from the column decoder 13 corresponding to the second column of the memory cell array MCA goes to high level, and the other outputs go to low level. Similarly, an output from the row decoder 16 corresponding to the second row of the memory cell array MCA goes to the high level, and the other outputs go to the low level. When the MOS transistor Q1 is turned on, the mode designation signal SM goes to the Vpp (12.5 V) level. Since an output from the column decoder 13 corresponding to the second column of the memory cell array MCA is set at the high level, an output from the voltage level switching section 12-2 goes to the Vpp level, and this voltage Vpp is applied to the gate of the column selection transistor CST2. Therefore, the column selection transistor CST2 is turned on. When the mode designation signal SM goes to the Vpp level, an output from the voltage level switching circuit 22 goes to the Vpp' level (10 V), and this high voltage Vpp' is applied to the bit line BL2. On the other hand, since an output from the row decoder 16 corresponding to the second row of the memory cell array MCA is set at the high level, an output from the voltage level switching section 15-2 is set at the high level, i.e., the vpp level (12.5 V), and this Vpp level is applied to the word line WL2. Since the MOS transistor Q4 is ON, all the source lines SL1, SL2, . . . are set at ground potential. Note that the non-selected word and bit lines are set at the ground potential.

Therefore, a high-intensity electric field is applied across the drain and the source of the selected memory cell MC22, and electrons having a high energy which exceeds a barrier (3.1 eV) between the substrate 40 and the first gate insulating film (silicon oxide film) 45 is generated, thus injecting hot electrons in the floating gate electrode 46 of the memory cell MC22. Therefore, after the data "0" is written, a threshold voltage viewed from the control gate electrode 48 of the selected memory cell MC22 is increased, thus setting an OFF ("0") state.

As described above, when hot electrons are injected into the floating gate electrode 46 of the selected memory cell transistor MC22, the data "0" is written in the transistor MC22. Similarly, the data "0" is written in the selected arbitrary memory cell transistor MCij (i=1 to m, j=1 to n).

In a data "1" write operation, basically, the cell transistor in which data are erased, i.e., the cell transistor in which the data "0" is not written is used as the cell transistor in which the data "1" is written. At this time, a "0" (low level) output is supplied as the write data Din.

On the other hand, in a data read mode, the read enable signal RE goes to the high level, and the program signal PR and the write enable signal WE go to the low level. As a result, the MOS transistor Q3 is turned on, and the MOS transistor Q4 is turned off. A voltage set at a Vcs level (2 V) is applied to the source lines SL1, SL2, . . . . The low-level program signal PR turns off the MOS transistor Q1 and turns on the MOS transistor Q2. The mode designation signal SM goes to the Vcc level, and the output levels of the voltage level switching circuits 12 and 15 are set at the Vcc level (5 V). The logic "1" (high level) data Din turns off the MOS transistor Q5, and the high level read enable signal RE turns on the MOS transistor Q6. For example, if the memory cell transistor MC12 is selected to read data, an output from the column decoder 13 corresponding to the second column of the memory cell array MCA goes to the high level, and the other outputs go to the low level. Similarly, an output from the row decoder 16 corresponding to the first row of the memory cell array MCA goes to high level, and the other outputs go to the low level. Since an output from the column decoder 13 corresponding to the second column of the memory cell array MCA is set at the high level, an output from the voltage level switching section 12-2 goes to the Vcc level, and this voltage Vcc is applied to the gate of the column selection transistor CST2. Therefore, the column selection transistor CST2 is turned on. On the other hand, since an output from the row decoder 16 corresponding to the first row of the memory cell array MCA is set at the high level, an output from the voltage level switching section 15-1 is set at the high level (Vcc), and this Vcc level is applied to the word line WL1. Note that the non-selected word and bit lines WL and BL are set at the ground potential. As a result, the cell transistor MC12 is selected, and data stored in the cell transistor MC12 is read out. When hot electrons are injected into the floating gate of the cell transistor MC12, this transistor MC12 is OFF. Therefore, a state wherein an input node of the inverter 23 is charged from the power source Vcc through the resistor 24 is maintained. Thus, the output signal Dout from the inverter 23 goes to the logic "0" level. On the other hand, if hot electrons are not injected into the floating gate of the cell transistor MC12, the transistor MC12 is turned on, and a current is supplied from the power source Vcc through the resistor 24, the current path between the drain and the source of the MOS transistor Q6, the current path between the drain and the source in the column selection transistor CST2, and the current path between the drain and the source in the cell transistor MC2. As a result, a potential at the input node of the inverter 23 is decreased, and the output signal Dout goes to the logic "1" level.

Similarly, stored data ("0" or "1") is read out on the bit line BL from the selected arbitrary memory cell transistor MCij (i=1 to m, j=1 to n), and the readout data is detected and amplified by the sense amplifier and write circuit 17 to be output.

In the above-mentioned EEPROM according to the present invention, in the read mode, a positive voltage (2 V in this embodiment) is applied to the source or bit line to which a low biasing voltage is normally applied (the source line in this embodiment), with respect to all the cell transistors MC, and a drain voltage (5 V in this embodiment) higher than a normal voltage by the above positive voltage is applied to the cell transistors in the selected column, thus assuring a drain-source voltage required for a read operation. As a result, an effect equivalent to a back gate biasing effect with respect to the cell transistors connected to the column (bit line) to which the selected cell transistor is connected can be achieved. Thus, even if a threshold voltage $V_{TH}$ of the cell transistor is set to be negative due to overerase, this negative voltage $V_{TH}$ can be substantially shifted to a positive value in the read mode, thus reading data. Therefore, a read error, caused when the cell in an overerase state is connected to the same bit line as that of the selected cell transistor, can be prevented.

Figure 6:
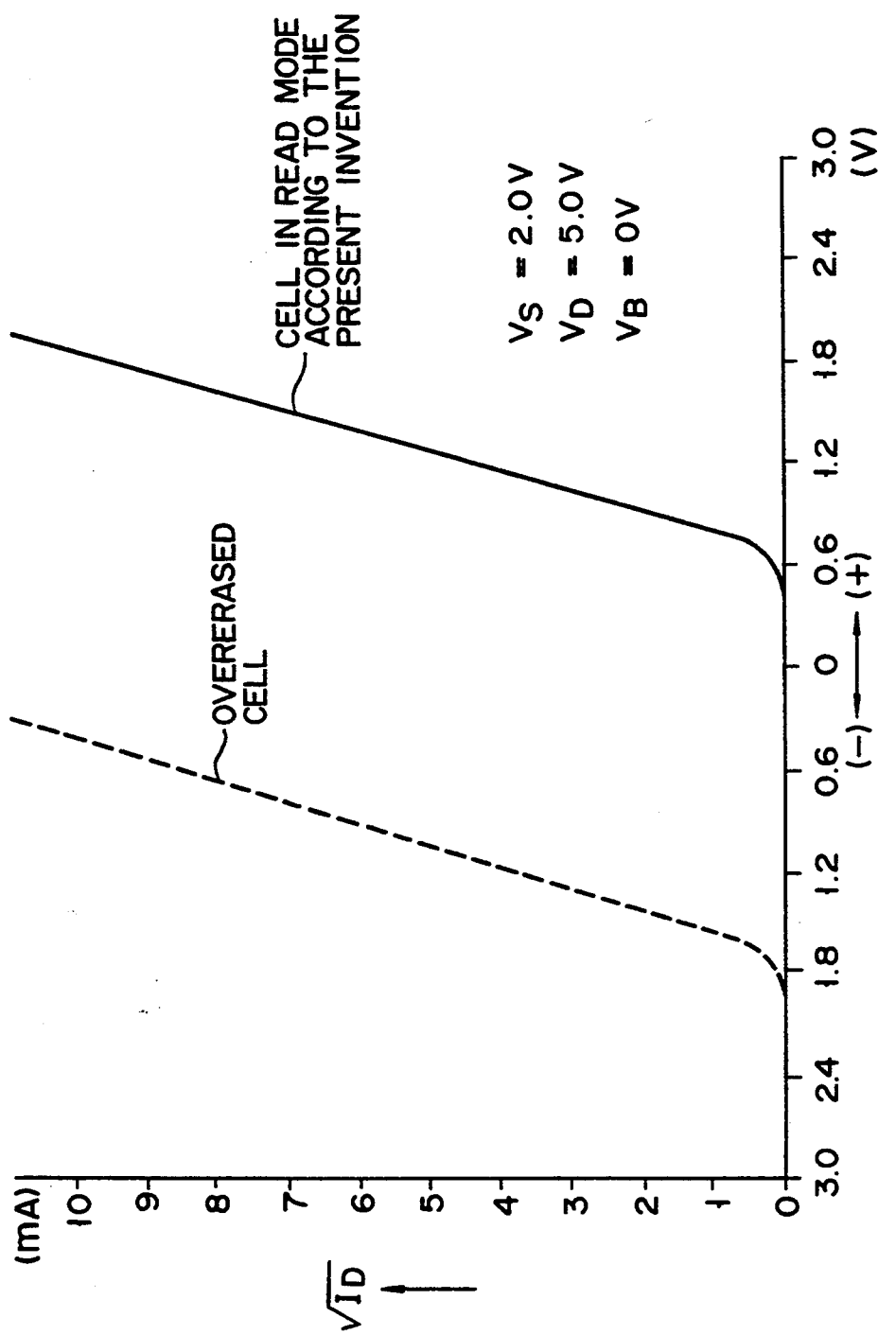
FIG. 6 is a graph of $V_G - \sqrt{I_D}$ characteristics showing a relationship between a voltage $V_G$ applied to a control gate of the memory cell and a root value $\sqrt{I_D}$ of a drain current $I_D$ of the cell, to explain an effect of preventing a read error, according to the present invention.

An effect of preventing a read error according to the present invention when a threshold voltage $V_{TH}$ of an arbitrary cell transistor is set to be negative due to overerase will be described hereinafter. FIG. 6 shows a relationship between the voltage $V_G$ applied to the control gate electrode of the cell and a root value $\sqrt{I_D}$ of a drain current $I_D$ of the cell (the source voltage $C_S$=2.0 V, the drain voltage $V_D$=5.0 V, and the substrate voltage $V_B$0 V). In this $V_G$–$\sqrt{I_D}$ characteristics, a broken curve represents characteristics obtained when the threshold voltage $V_{TH}$ of the cell is set to be negative due to overerase, and a solid curve represents characteristics obtained when the threshold voltage $V_{TH}$ of the above cell transistor is substantially shifted to a positive value in the read mode according to the present invention. In the above characteristics, the threshold voltage $V_{TH}$ of the cell transistor is set at about $-1.6$ V due to overerase when calculated by extrapolation. The drain current $I_D$ of 100 $\mu$A or more is supplied to this cell transistor when the gate voltage $V_G$=0 V. For this reason, as described above, this cell transistor is undesirably turned on in the read mode even if the gate voltage $V_G$ of the cell transistor is 0 V. If a cell transistor connected to the column to which the cell transistor thus erroneously turned on is selected, the drain current $I_D$ of the above cell transistor which is erroneously turned on may cause a read error.

In contrast to this, according to the present invention, voltages of 2 V and 5 V are respectively applied to the source and the drain of each cell transistor in the selected column in the read mode to assure a drain-source voltage VDS of 3 V. As a result, an effect equivalent to a back gate biasing effect with respect to the cell transistors in the selected column can be achieved. Thus, a positive value (0.7 V in this embodiment) can be obtained as the threshold voltage $V_{TH}'$ and the drain current $I_D$ is not supplied when the gate voltage $V_G$=0 V. Accordingly, when the cell transistor selected in the read mode is OFF, the other nonselected cell transistors connected to the column to which the selected transistor is connected are turned off even if the threshold voltage $V_{TH}$ is set to be negative due to overerase. Therefore, a data read operation of the selected cell transistor is not adversely affected, thus achieving a reliable data read operation.

Note that a voltage of 5 V is applied to the drain of the selected cell transistor in the read mode in the above embodiment. However, if the voltage of 5 V may cause read-retention (a phenomenon in which electrons are discharged from the floating gate electrode 46 to the drain region 44 in the read mode), the source potential $V_S$ may be reduced within the range in which the threshold voltage $V_{TH}$ of the cell is shifted to the positive value to obtain the effect according to the present invention. Since the drain current $I_D$ of the cell transistor can be reduced within an allowable margin of the sensitivity of the sense amplifier, the drain-source voltage may be reduced to be 3 V or less. Thus, a reduction in drain-source voltage $V_{DS}$ is effective as a countermeasure to prevent soft-write in which hot electrons are injected into the floating gate electrode 46 of the cell transistor in the read mode.

In order to prevent such soft-write as has been described, it is advisable to discharge electrons from the floating gate electrode into the source region when the data is simultaneously erased. When the electrons are so discharged, the voltage applied to the source region is only 2 V at most in the case of the embodiment described above. It is desirable that the diffusion layer contacting the thin region 45A formed on part of the first gate oxide film 45 (FIG. 5) be set at as low a potential as possible. The potential on the diffusion layer can be reduced by a slight design change of the circuit.

As is shown in the above table, the drain voltage $V_D$ required for data-writing is 10 V. This voltage can be reduced to 7 to 8 V provided sufficient number of hot electrons have already been generated. To reduce the voltage from 10 V to 4 to 8 V, it suffices to divide resistance by means of a load elements (either resistors or transistors).

What is claimed is:

1. A non-volatile semiconductor memory device from which data is read during a data read mode, comprising:
   a memory cell array in which a plurality of non-volatile memory cells each having source and drain regions in arranged in a row and column matrix;
   row selecting means for selecting a row of non-volatile memory cells in said memory cell array;
   column selecting means, coupled to one of the source and drain regions of said non-volatile memory cells, for selecting a column of non-volatile memory cells in said memory cell array;
   first voltage level setting means for setting an output voltage level of said row selecting means;
   second voltage level setting means for setting an output voltage level of said column selecting means; and
   voltage control means for controlling said first and second voltage level setting means, said voltage control means including means for supplying voltage to the other of said source and drain regions of said non-volatile memory cells, said voltage supplying means and said second voltage level setting means respectively supplying first and second voltages to source and drain regions of non-volatile memory cells in said selected column of said memory cell array during the data read mode, wherein the lower of said first and second voltages is a positive voltage sufficient to back bias an over-erased non-volatile memory cell in said selected column so that the threshold voltage level required to turn the overerased non-volatile memory cell ON is positive.

2. The device according to claim 1, wherein each of said non-volatile memory cells includes source and drain regions of a second conductivity type formed in a major surface region of a semiconductor substrate of a first conductivity type and spaced apart from each other by a predetermined distance, a first gate insulating film formed on said semiconductor substrate between said source and drain regions, a floating gate electrode formed on said first gate insulating film, a second insulating film formed on said floating gate electrode, and a control gate electrode formed on said second gate insulating film.

3. The device according to claim 2, wherein said first gate insulating film includes a portion, adjacent to one of said source and drain regions, having a thickness less than that of a remaining portion of said first gate insulating film.

4. The device according to claim 1, further comprising a plurality of source lines to which the source regions of the memory cells are coupled, wherein each of said source lines commonly connects the source regions of the non-volatile memory cells in two adjacent rows of said memory cell array, said source lines receiving the lower of the first and second bias voltages from said voltage supplying means.

5. The device according to claim 1, wherein said row selecting means includes row decoder means for decoding a row address signal to select a row of said memory cell array, and said column selecting means includes column decoder means for decoding a column address and column selection gate means, controlled in response to an output from said column decoder means, for selecting a column of said memory cell array.

6. The device according to claim 5, wherein said row decoder means includes a row address buffer for temporarily storing the row address signal and a row decoder for decoding the row address signal supplied from said row address buffer, said column decoder means includes sa column address buffer for temporarily storing the column address signal and a column decoder for decoding the column address signal supplied from said column address buffer, and said column selection gate means includes a plurality of MOS transistors, a first end of a current path of each of said MOS transistors connected to a corresponding one of a plurality of bit lines which are respectively coupled to the drains of the memory cell in a given column of said matrix, a second end of the current path of each of said MOS transistors being commonly connected, and the ON/OFF-switching of said MOS transistors being controlled in response to an output from said column decoder.

7. The device according to claim 1, wherein said first voltage level setting means respectively sets an output voltage level of said row selecting means at 0 V in an erase mode, at 12.5 V in a data "0" write mode, at 0 V in a data "1" write mode, and at 5 V in a read mode, and said second voltage level setting means respectively sets an output voltage level of said column selecting means at 20 V in the erase mode, at 10 V in the data "0" write mode, at 0 V in the data "1" write mode, and at 5 V in the read mode.

8. The device according to claim 1, wherein said voltage control means further includes mode designation signal outputting means for selectively switching an output voltage level of each of said first and second voltage level setting means and wherein said voltage supplying means supplies a positive voltage to the source region of each of said non-volatile memory cells in a data read mode, and supplies a ground voltage to said source in the data write mode, to thereby set a high-impedance state in an erase mode.

9. The device according to claim 8, wherein said mode designation signal outputtting means respectively outputs a mode designation signal of 20 V in the erase mode, 12.5 V in the write mode, and 5 V in the read mode in response to a program signal.

10. The device according to claim 8, wherein said voltage applying means respectively outputs a voltage of 2 V or 0 V in response to a read or write enable signal in the data read mode or the data write mode, thereby setting a high-impedance state in the erase mode.

11. A non-volatile semiconductor memory device from which data is read in response to a memory reading signal, said semiconductor memory device comprising:
- a plurality of memory cells arranged in a row and column matrix, each memory cell comprising a non-volatile memory cell transistor having a control gate and source and drain regions;
- a plurality of source lines arranged such that the source regions of the memory cell transistors in a given row of said matrix are coupled to the same source line;
- a plurality of bit lines arranged such that the drain regions of the memory cell transistors in a given column of said matrix are coupled to the same bit line;
- row selecting means responsive to row address data for selecting at least one row of non-volatile memory cell transistors in accordance with row selection signals output therefrom;
- column selecting means responsive to column address data for selecting at least one column of non-volatile memory cell transistors in accordance with column selection signals output therefrom;
- first voltage level setting means coupled to said row selecting means for selectively setting voltage levels of the row selection signals;
- second voltage level setting means coupled to said column selecting means for selectively setting voltage levels of the column selection signals; and
- voltage control means for controlling the selective setting of the voltage levels by said first and second voltage level setting means, said voltage control means including voltage supplying means, wherein said voltage supplying means and said second voltage level setting means supply respective positive voltages to the source and drain regions of said non-volatile memory cell transistors in said at least one selected column in response to the memory reading signal such that an overerased non-volatile memory cell transistor in said at least one selected column has a positive threshold voltage.

12. The non-volatile semiconductor memory device in accordance with claim 11 wherein said voltage supplying means supplies positive voltages to non-volatile memory cell transistors coupled to the same bit line as a selected memory cell from which data is read.

13. The non-volatile semiconductor memory device in accordance with claim 11 wherein said voltage supplying means is coupled to said source lines and said bit lines and includes means for applying first and second bias voltages to the source and drain regions of the non-volatile memory cell transistors in said at least one selected column to generate a voltage Vds across the source and drain regions of the non-volatile memory cell transistors in said at least one selected column.

14. The non-volatile semiconductor memory device in accordance with claim 13 wherein Vds is approximately equal to 3 V.

15. The non-volatile semiconductor memory device in accordance with claim 13 wherein the lower of the first and second bias voltages is approximately +2 V.

16. The non-volatile semiconductor memory device in accordance with claim 13 wherein the lower of the first and second bias voltages is applied to the source of the memory cell transistors.

17. The non-volatile semiconductor memory device in accordance with claim 13 wherein the first bias voltage is approximately 2 V and the second bias voltage is approximately 5 V.

18. The non-volatile semiconductor memory device in accordance with claim 11 wherein first and second rows of memory cells transistors are coupled to the same source line.

19. The non-volatile semiconductor memory device in accordance with claim 11 further comprising:
- a plurality of row lines arranged such that the gate of the memory cell transistors in a given row of said matrix are coupled to the same row line, the row lines being respectively coupled to said first voltage level setting means.

20. A non-voltage semiconductor memory from which data is read in response to a memory reading signal, said semiconductor memory device comprising:
- a plurality of memory cells arranged in a row and column matrix, each memory cell comprising a non-volatile memory cell transistor having a control gate and source and drain regions;
- selecting means for selecting at least one non-volatile memory cell transistor from said row and column matrix for data reading in response to the memory reading signal; and
- voltage supplying means for supplying a positive voltage to the control gate of each of the non-volatile memory cell transistors in the same row of said row and column matrix as a non-volatile memory cell selected for data reading by said selecting means and for supplying positive voltages to the source and drain regions of non-volatile memory cell transistors in at least the same column of said row and column matrix as the selected non-volatile memory cell, at least one of said positive voltages being sufficient to back bias an overerased non-volatile memory cell transistor in the same column of said row and column matrix as the selected non-volatile memory cell so that said overerased non-volatile memory cell transistor requires a positive voltage to be applied to its control gate to turn ON.

21. The non-volatile semiconductor memory in accordance with claim 20 wherein and voltages supplying means includes means for respectively applying first and second bias voltages to the source and drain regions of the non-volatile memory cell transistors in the same column as the selected non-volatile memory cell to generate a voltage Vds across the source and drain regions of the non-volatile memory cell transistors in the same column as the selected non-volatile memory cell.

22. The non-volatile semiconductor memory in accordance with claim 21 wherein Vds is approximately equal to 3 V.

23. The non-volatile semiconductor memory in accordance with claim 21 wherein the lower of the first and second bias voltages is approximately +2 V.

24. The non-volatile semiconductor memory in accordance with claim 21 wherein the lower of the first and second bias voltages is applied to the source region of the memory cell transistors.

25. A method of reading data from a non-volatile semiconductor memory comprising a plurality of memory cells arranged in a row and column matrix, each memory cell comprising a non-volatile memory cell transistor having a control gate and source and drain regions, the method comprising the steps of:
- selecting at least one memory cell transistor from said row and column matrix for reading data therefrom in response to a memory reading signal; and supplying a positive voltage to the control gate of each memory cell transistor in the same row as a selected memory cell transistor and supplying positive voltages to the source and drain regions of non-volatile memory cell transistors in at least the same column of said row and column matrix as the selected non-volatile memory cell, at least one of the positive voltages being sufficient to back bias an overerased non-volatile memory cell transistor in at least the same column of said row and column matrix as the selected non-volatile memory cell so that said overerased non-volatile memory cell transistor requires a positive voltage to be applied to its control gate in order to turn ON.

26. The method in accordance with claim 25 wherein said step of supplying positive voltages comprises respectively applying first and second bias voltages to the source and drain regions of the non-volatile memory cell transistors to generate a voltage Vds across the source and drain regions of the non-volatile memory cell transistors.

27. The method in accordance with claim 26 wherein Vds is approximately 3 volts.

28. The method in accordance with claim 26 wherein the lower of the first and second bias voltages is approximately +2 V.

29. The method in accordance with claim 26 wherein the lower of the first and second bias voltages is applied to the source region of the memory cell transistors.

* * * * *